(12) United States Patent
Shum et al.

(10) Patent No.: US 7,190,022 B2
(45) Date of Patent: *Mar. 13, 2007

(54) ONE TRANSISTOR FLASH MEMORY CELL

(75) Inventors: Danny Shum, Austin, TX (US); Georg Tempel, Sterrebeek (BE); Ronald Kakoschke, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 11/081,886

(22) Filed: Mar. 16, 2005

(65) Prior Publication Data

US 2005/0180215 A1    Aug. 18, 2005

(51) Int. Cl.
*H01L 29/788*    (2006.01)
(52) U.S. Cl. .............. 257/316; 257/318; 257/368; 257/374; 257/E27.014
(58) Field of Classification Search ........... 257/316
See application file for complete search history.

(56) References Cited

U.S. PATENT DOCUMENTS

| 4,979,004 | A | 12/1990 | Esquivel et al. |
| 5,486,714 | A | 1/1996 | Hong |
| 5,635,415 | A | 6/1997 | Hong |
| 5,644,532 | A | 7/1997 | Chang |
| 5,994,733 | A | 11/1999 | Nishioka et al. |
| 6,211,012 | B1 * | 4/2001 | Lee et al. ............ 438/257 |
| 6,307,781 | B1 | 10/2001 | Shum |
| 6,327,182 | B1 | 12/2001 | Shum et al. |
| 6,418,060 | B1 | 7/2002 | Yang et al. |
| 6,438,030 | B1 | 8/2002 | Hu et al. |
| 6,559,008 | B2 | 5/2003 | Rabkin et al. |
| 6,600,199 | B2 | 7/2003 | Voldman et al. |

(Continued)

FOREIGN PATENT DOCUMENTS

EP            0562307              9/1993

(Continued)

OTHER PUBLICATIONS

Kume, Hitoshi, et al., "A 1.28 m Contactless Memory Cell Technology for a 3V-Only 64Mbit EEPROM," 992-IEDM 92-991, pp. 24.7.1, 24.7.2 and 24.7.3, 1992.

(Continued)

*Primary Examiner*—Tu-Tu Ho
(74) *Attorney, Agent, or Firm*—Slater & Matsil, L.L.P.

(57) ABSTRACT

An integrated circuit has a high voltage area, a logic area and a memory array for forming a system on a chip that includes linear, logic and memory devices. The memory array has floating gate transistors disposed in a triple well structure with a raised drain bit line 13 substantially vertically aligned with a buried source bit line 14. The memory array separates the columns with deep trenches 46 that may also be formed into charge pump capacitors.

20 Claims, 7 Drawing Sheets

U.S. PATENT DOCUMENTS

| | | |
|---|---|---|
| 6,628,544 B2 | 9/2003 | Shum et al. |
| 6,667,226 B2 | 12/2003 | Pinto et al. |
| 6,693,830 B1 | 2/2004 | Hu et al. |
| 6,815,311 B2 | 11/2004 | Hong et al. |
| 6,841,824 B2 | 1/2005 | Shum |
| 6,844,588 B2 | 1/2005 | Cavins et al. |
| 6,864,151 B2 | 3/2005 | Yan et al. |
| 6,864,530 B2 | 3/2005 | Yoon |
| 6,885,080 B2 | 4/2005 | Chen et al. |
| 6,909,139 B2 * | 6/2005 | Shum et al. ............... 257/315 |
| 2001/0000306 A1 * | 4/2001 | Yoon et al. ............ 365/185.28 |
| 2002/0000602 A1 * | 1/2002 | Lee ........................... 257/314 |
| 2002/0033516 A1 | 3/2002 | Choi et al. |
| 2002/0038882 A1 * | 4/2002 | Hartmann et al. ......... 257/314 |
| 2002/0070402 A1 | 6/2002 | Ichige et al. |
| 2002/0110973 A1 * | 8/2002 | Liou et al. ................. 438/211 |
| 2002/0132425 A1 * | 9/2002 | Song et al. ................ 438/257 |
| 2002/0151188 A1 * | 10/2002 | Kamath et al. ............ 438/769 |
| 2002/0197795 A1 | 12/2002 | Saito |
| 2003/0071297 A1 | 4/2003 | Hara et al. |
| 2003/0080366 A1 | 5/2003 | Tamura |
| 2003/0162400 A1 | 8/2003 | Chen et al. |
| 2004/0262669 A1 | 12/2004 | Shum et al. |
| 2005/0045944 A1 | 3/2005 | Gratz et al. |

FOREIGN PATENT DOCUMENTS

| | | |
|---|---|---|
| JP | 02310971 | 12/1990 |
| JP | 04164372 | 6/1992 |
| WO | WO 9736332 | 10/1997 |
| WO | WO 9944238 | 9/1999 |
| WO | WO 0215190 | 2/2002 |

OTHER PUBLICATIONS

Kim, K. S., et al., A Novel Dual String NOR (DuSNOR) Memory Cell Technology Scalable to the 256 Mbit and 1 Gbit Flash Memories, 0-7803-2700-4, 1995, IEDM 95-263; pp. 11.1.1, 11.1.2, 11.1.3 and 11.1.4.

Chi-Nan Brian Li, et al., "A Novel Uniform-Channel-Program-Erase (UCPE) Flash EEPROM Using an Isolated P-well Structure", IEEE, 2000 (Apr. 2000) 0-7803-6441-4/00.

Evans Ching-Song Yang, et al., "Novel Bi-Directional Tunneling Program/Erase NOR (BiNOR)-Type Flash EEPROM", IEEE 1999, 0018-9383/99, vol. 46, No. 6, Jun. 1999, pp. 1294-1296.

* cited by examiner

ONE TRANSISTOR FLASH MEMORY CELL

This application claims the benefit of the filing date of U.S. Ser. No. 10/607,610 filed Jun. 27, 2003, now U.S. Pat. No. 6,909,139.

BACKGROUND

Flash memory cells have enjoyed recent commercial success due to their relatively low cost, the ease in erasing information stored in a flash memory array and their applications to bank check cards, credit cards, and the like. There is no current industry standard flash memory cell. Many types of flash memories exist which embody many different architectures. The programming, reading and erasing of cells can be generally described under one of the following architectures-NOR, AND, or NAND. Further, the programming mechanism of the flash memory cell typically involves Fowler-Nordheim tunneling through an energy barrier or electron injection over an energy barrier.

The array erase mechanism for Fowler-Nordheim cells can involve floating gate to channel, floating gate to drain or floating gate to source as the charge clearing path from the floating gate. The floating gate to drain or source path can prove deleterious to cell operation by destroying the tunnel oxide area located between the floating gate overlap and the drain/source region. The tunnel oxide may also be destroyed through the Fowler-Nordheim programming mechanism or by electron injection (e.g., programming a logic one or logic zero on the floating gate) of conventional flash cells. These programming mechanisms may include charge carrier paths between the floating gate and drain or alternatively between the floating gate and source. However, conventional cells in NOR or AND architectures do not include a programming operation involving a path between the channel and floating gate. Such an operation would be desirable from a standpoint of limiting tunnel oxide degradation due to the field re-distribution effect across the entire tunnel oxide region. In my U.S. Pat. No. 6,307,781 I disclose and claim a triple well structure for a floating gate transistor that permits uniform channel programming. That structure reduces tunnel oxide damage by permitting a uniform voltage across the channel during programming and erasing.

Flash memory cells are often fabricated on the same substrate with logic or linear transistors. In order to have an efficient manufacturing process, the transistors for the control gate in the flash memory cells and the logic and linear transistors often share the same polysilicon mask. They also share the same sidewall oxidation process and the same reactive ion etch (RIE) of the gate. While the sharing of common steps is efficient, it also presents one or more technical problems. As feature sizes shrink, logic and/or linear transistors require ultra shallow source and drain junction formation to avoid short channel effect (SCE). In order to achieve such ultra shallow source and drain junction formation the thermal budget for manufacturing the device must be kept very low. In my copending U.S. patent application Ser. No. 10/234,344 (now U.S. Pat. No. 6,841,824), filed Sep. 4, 2002, I disclose a method for making flash memories and logic and linear devices on the same substrate.

Despite the above developments, there still remain a number of problems for integrating non-volatile memory technology with conventional CMOS logic and linear devices and processes. I have found that uniform channel programming as employed in NAND or AND architectures extend the scaling limit of memory technology because no voltage differential is applied between the drain and the source during programming or erasing. That is, the bias for the source, the drain, and the well are the same, Vsource=Vwell. However, NAND devices suffer from slow reading times due to their inherent serial access mode. In addition, AND devices require dedicated and separate source and drain bit lines. As such, the conventional metal pitch of an AND memory device requires two metal lines with space in between them in order to separate the source bit line from the drain bit line. Other problems with prior art combination devices is that conventional uniform channel programming in such devices share a well for a common body contact. This common body contact may cause gate induced drain leakage current during programming among the unselected cells. With prior art flash memory devices, a single power supply was provided for VCC. All voltages used in the devices were generated on-board and they require large charge pump areas to sustain the leakage due to the gate induced drain leakage. Also, certain high voltage devices when formed on the same substrate, require or use conventional shallow trench isolation and needs large N+/N+ spacing. In other words, they need large peripheral areas.

No one prior art solution addresses all of these problems. It is known in certain uniform channel programming architecture that one may provide N+ buried bit lines. It is also known that the spacing between surface bit lines can be improved by arranging the lines in a jogged manner or by jogging the source and drain contacts. Still others have used isolated P-wells and/or local P-well technology. However, no one of these prior techniques addresses all of the issues raised above.

SUMMARY

The invention provides a flash memory array and a method of making the flash memory array in a semiconductor substrate. The array includes a plurality of floating gate transistors arranged in rows and columns. The sources and drains of the transistors are arranged serially in columns and are aligned with each other in each column. Each source is separated from each drain by a floating gate. The transistors are arranged so that serially adjacent transistors share a common source or common drain. The sources are connected together in the substrate to form a buried bit line. A P+ body tie is implanted in a number of the sources to eliminate the need for a common well to provide the body contact. The drains are connected together over the substrate by raised bit lines. They are formed from a layer of conductive material, such as metal, that is patterned into lines that extend the length of the columns. The raised bit lines are vertically aligned with the buried bit lines so that the overall dimensions of the array are small. By aligning the bit lines in each column with each other, the active areas on the surface of the array are efficiently used to maximize the density of the array and to minimize the areas devoted to contact regions. The transistors of the array are formed in a triple well that includes P-type substrate, a deep N-well and a shallow P-well enclosed in the deep N-well. Adjacent columns are isolated by deep trenches that extend below the shallow P-well and into the deep N-well.

DETAILED DESCRIPTION

Figure 1:
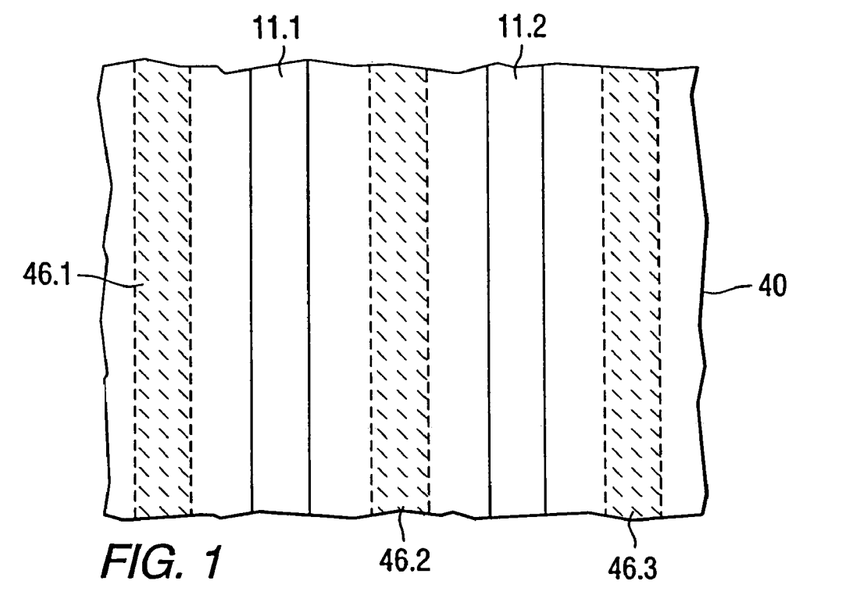
FIG. 1 is a plan view of a substrate with columns for the sources and drains.

Turning to FIG. 1, there is shown a P-type substrate 40. A deep N-well 41 is formed in the substrate 40 and a number of high voltage (HV) P-wells 42 are formed in the deep N-well. The surface of the substrate 40 is masked with a screen oxide 45 or other suitable mask to form openings 11.1, 11.2, . . . 11.n for the columns of the array. The active areas in a column are isolated from adjacent active areas by deep trenches 46.1, 46.2, 46.3, . . . 46.n that extend below the deep N-well 41. In order to explain the rest of the structure, the deep trenches are omitted from FIGS. 2 and 3. Progressing to FIG. 2, the substrate 40 is further processed to form a plurality of word lines 15.1, 15.2, . . . 15.n that extend as rows that cross the columns 11.n. For each transistor a floating gate structure is formed over the crossing of the word line and the column.

Figure 2:
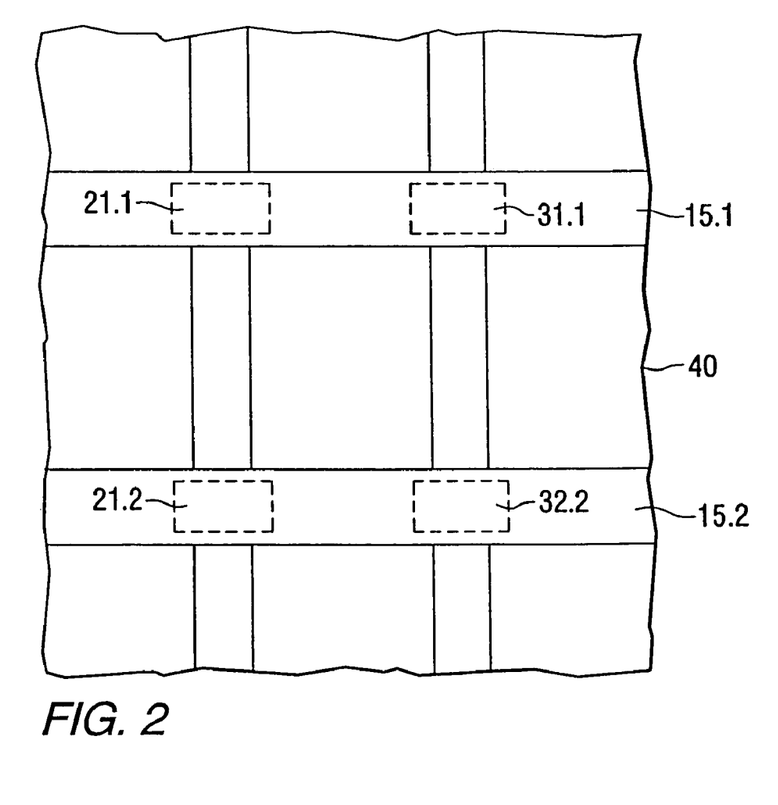
FIG. 2 is a plan view of the substrate where word lines with floating gates are formed in rows across the columns.

Common sources such as 22, 27 and 32, 37 are formed between the word lines. A P+ body implant 24, 34 is made into the source region. The source diffusion forms, in effect, a common, buried source bit line 14. A raised common drain bit line 13 will be formed later in the process over the buried source bit line so that the source and drain bit lines will be substantially vertically aligned with each other.

Figure 3:
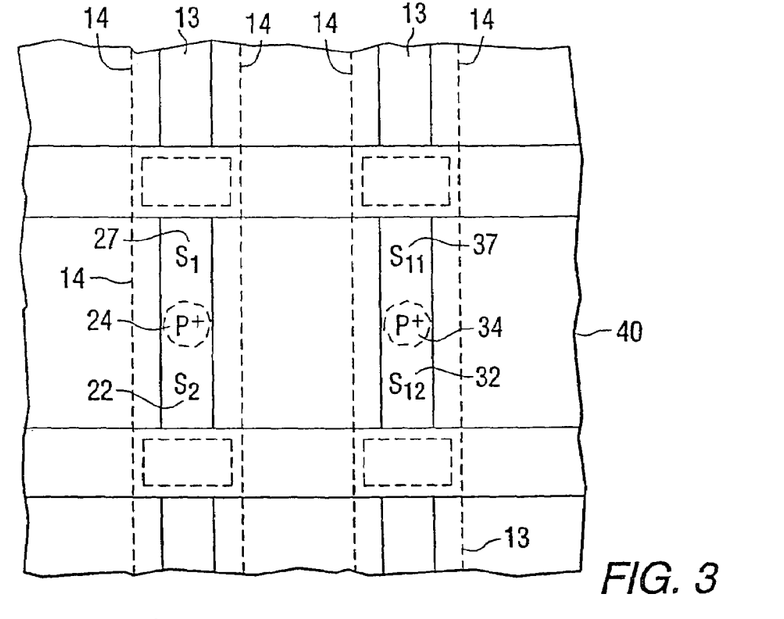
FIG. 3 is a further view of FIG. 2 where the sources and the body ties are formed in the columns of the array.
Figure 4:
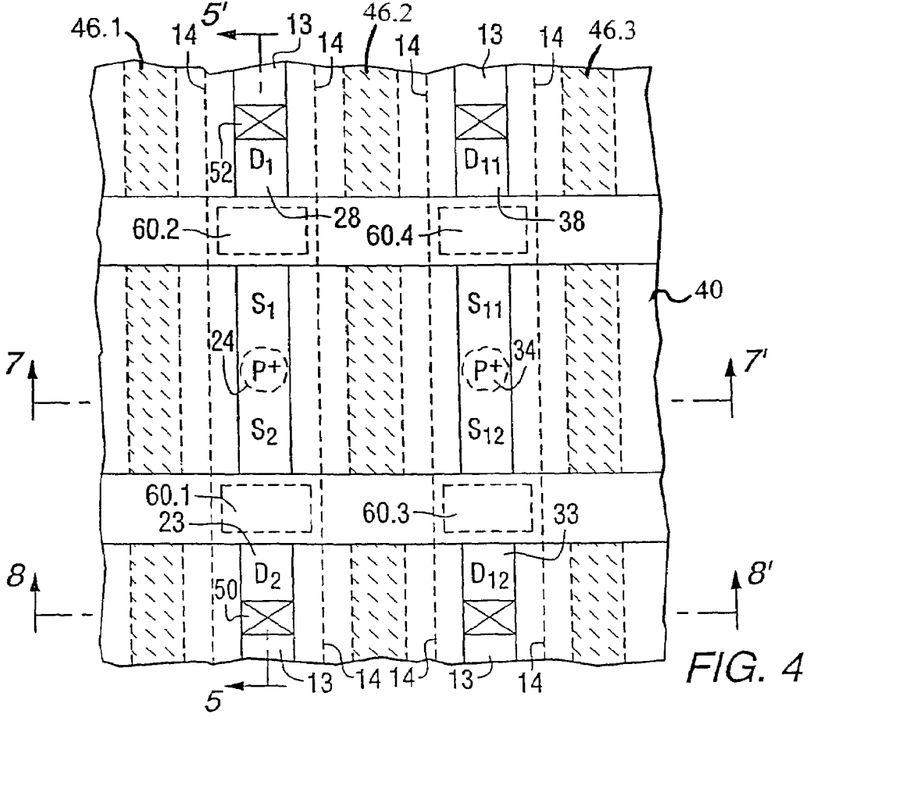
FIG. 4 is a further view where drains are formed.
Figure 8:
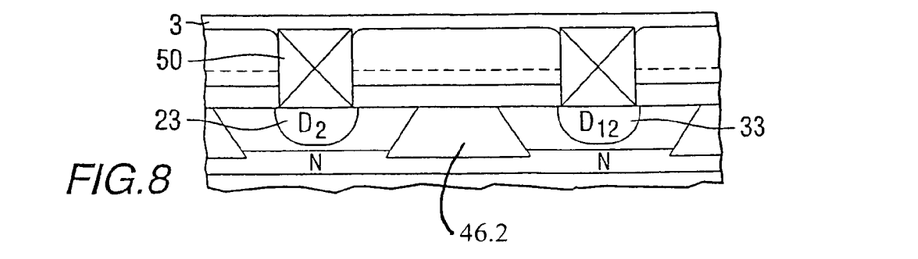
FIG. 8 is a cross sectional view taken along the line of 8–8' and through drain regions in adjacent columns.

The drain regions, such as 23, 28 and 33, 38 are shown in FIG. 4. The raised drain bit lines 13 are formed from metal 1 that passes through vias to contact the drains. As shown in FIGS. 3, 4 the raised bit line 13 is connected to the drains and the buried bit line 14 is connected to the sources. They occupy about the same planar location but are separated vertically from each other. For purposes of illustration, the buried bit line 14 is shown in dashed outline in both figures and is wider than the raised bit line 13. In practice, the lines may be the same or different widths. Each combined drain region has a contact 50n that extends to the surface of the device. The contacts 50n are isolated from each other and from the floating gate stack 60.n, 61.n, 62.n, 63.n. The contacts 50n extend vertically through the isolation layer 54 to contact the drain regions 23, 28, 33, 38 on the surface of the substrate 40, as shown in FIGS. 4, 8. The contacts are formed by opening vias in the insulation layer, depositing a layer of metal 500 over the insulation layer 54 and in its vias, and then patterning the metal layer 500 into a set of metal lines 500.1, 500.2, . . . 500.n that form the raised bit lines of the array, one metal line per bit line.

Both of these wells (HV P-wells and deep N-wells) are to be shared in the memory region as well as in the HV peripheral regions to reduce mask costs. The wells are formed with a high energy implant process that is known as the "retrograde well process" in the semiconductor industry. The implant has a depth profile that is typically greater than 0.7 μm for P and greater than 1.5 μm for N. That profile is necessary in order for the memory to generate sufficient high voltage, typically greater than 12V, to avoid junction punch-through for write and erase operations.

Figure 5:
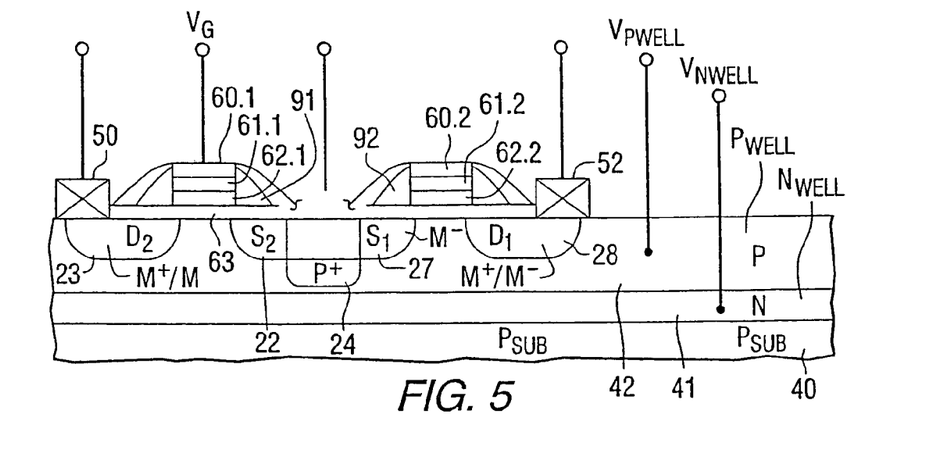
FIG. 5 is a cross section view taken along the line 5–5' of FIG. 4 and shows the structure of two serially connected floating gate transistors.

FIG. 5 shows a typical floating gate structure that includes an insulating tunnel oxide layer 63 (typically thin $SiO_2$ or oxynitride) on the surface of the substrate 40, a first conductive, charge storage layer on the insulating layer that forms the floating gate 62, an insulating, layer 61 (typically an ONO layer) on the lower conductive layer, and a second conductive layer on the charge storage layer that forms the control gate 60. In response to a set of voltages applied to the control electrodes and to the wells, charge may be stored, or erased from the floating gate transistor or the charging state will be sensed in the read mode. The function and operation of triple well floating gate transistors are known. Details of their structure, manufacture and operation are provided in one or more of my other patents or pending applications whose entire contents are herein incorporated by reference. My patent and pending applications include U.S. Pat. No. 6,307,781, and U.S. Ser. Nos. 10/234,344 (now U.S. Pat. No. 6,841,824), filed Sep. 4, 2002 and 10/057,039 (now U.S. Pat. No. 6,628,544), filed Jan. 25, 2002.

Portions of the active areas between deep trenches are masked and self-aligned openings to spacers 91, 92 in order to form body tie regions. Source regions 22, 27, 32, 37 and others are formed by implanting the substrate with suitable N-type dopants and diffusing the dopants into the P-wells 42. The deep trenches prevent the sources from laterally spreading into adjacent columns. The sources are further masked and self-aligned to spacers 91, 92. A P-type implant is made into the opening between spacers 91, 92 to form $P^+$ body ties 24, 34 in the source regions. Thus each source is diffused via $n^-/P^+$ body tie to provide a continuous, buried bit line 14 in the common P-well 42. This buried bit line resistance is further reduced by subsequent silicide process prior to contact formation. Such silicidation must take place in the $P^+$ 24 overlap the $n^-$ region, extend to both ends of $n^-$ region 22 and 27 but avoid extend to under the gate edge. Not every combined source region has a contact by a metal strap. It is sufficient to form contact with an upper level metal strap every thirty-two or sixty-four word lines 15 to reduce well resistance while maintain single metal line per bitline simplicity. The added upper level of metal is simple to add and does not adversely effect the footprint of the embedded memory array because its core processor already uses many levels of metals.

The transistors in a typical cell of the array are shown in FIG. 5. The substrate 40 has a deep N-well 41 and a shallow P-well 42. The transistors are in the P-well 42. From left to right, there is a drain region 23, a first floating gate stack (60.1, 61.1, 62.1), first and second sources 22, 27 with a $P^+$ body tie 24, a second floating gate stack (60.2, 61.2, 62.2), and a second drain 28. Drain contacts 50, 52 extend above the substrate 40 to contact a raised metal bit line 500.

Figure 7:
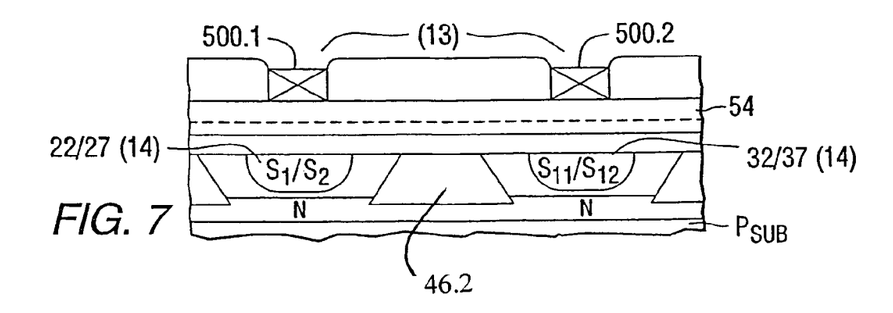
FIG. 7 is a cross sectional view taken along the line 7–7' and through source regions in adjacent columns.

Source regions 22, 27 form buried bit lines 14 that are vertically aligned with the raised metal bit lines. A higher (upper level) metal line runs in parallel with and above drain bit line 500 and contacts the source buried bit lines 14. The sources, drains and control gates are silicided. Sidewall oxide and spacers isolate the 30 gates from the drains and sources. As shown by deep trench 46.2 in FIGS. 7 and 8, the deep trenches separate adjacent columns and buried bit lines 14 from each other.

As a result of the above structure and the process for forming the structure, the invention achieves cell scaling and provides a uniform channel programming architecture that has buried bit lines with source and P-well ties to replace a conventional metal bit line. The invention saves one metal bit line per column for each column in the array when compared to prior art arrays. Likewise the source and the P-well are held at the same potential during programming, erase and read operations. With the invention, no surface source contact is needed due to the source and P-well and body tie. The invention introduces a true isolated well concept by isolating adjacent columns from each other using a deep trench isolation process. In this process, the trenches are etched to a depth of between 1 and 3 microns deep. This deep trench process may be used in conjunction with shallow trench isolation processes that are typically found in logic and linear designs. These and other objects in the invention are achieved by using P+ implants and silicide over the sources and after a spacer is provided in order to provide P+ body ties to the N- body sources.

The deep trench isolation not only reduces the area of the substrate required to isolate one column from the next. As such, the invention permits denser memory arrays with more cells per unit area than is possible with shallow trench isolation. The deep trench isolation also isolates the memory arrays from the high voltage devices including the row and column decoders, transfer gates, etc. As such, the invention further reduces the isolation area between the high voltage devices to less than one micron compared to the shallow trench isolation of several microns for isolating high voltage devices from memory arrays.

As such, the invention provides in a memory or combination memory, logic and/or linear device and an isolated triple-well structure for the flash memory cells. The triple well provides a separate biasing well for programming. The separate biasing well reduces the gate induced drain leakage. As such, a smaller charge pump may be used and the memory device may be operated at lower power. The deep trench isolation of the invention creates decoupling capacitors when the trenches fill with doped material and properly insulating from the top surface, whose capacitance values are a few orders of magnitude higher than conventional well capacitors and consume much less area; suitable for charge pump design and provides a significant area reduction. In the past, when memory devices have been incorporated with high voltage devices, it was conventional to use shallow trench isolation for the memory transistors and the high voltage transistors with large isolation space e.g., N+/N+, N+/P+, P+/P+). However, high voltage transistors require more spacing than do memory transistors. By using shallow trench isolation for high voltage devices and deep trench isolation for memory devices, the overall device size is reduced, mostly due to isolation space reduction that was enabled by the deep trench technology.

Figure 9:
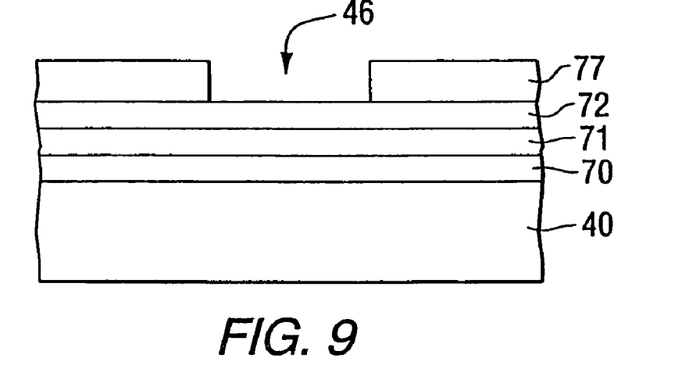
FIGS. 9–11 show steps for making the deep trenches.
Figure 10:
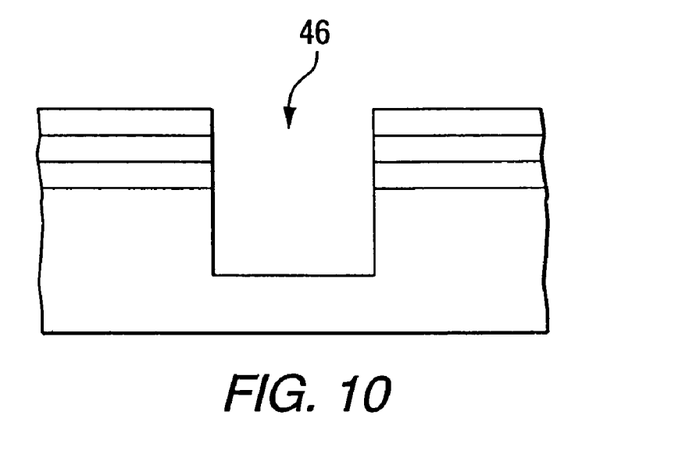
Figure 11:
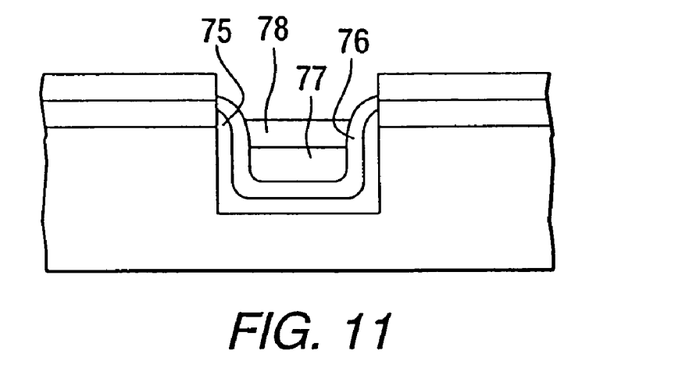

Turning to FIG. 9–10, there are shown the steps involved in fabricating the deep trench 46 of the invention. The deep trench is formed at the beginning of the process generally before the shallow trench isolation that is used to separate the high voltage and CMOS devices. This provides a modular approach for System-on-Chip (SoC) and avoids any unwarranted effects introduced by the addition of deep trench process on the base logic process. The following flow is just one embodiment for making devices with the invention. Those skilled in the art will understand that other process steps may be used to achieve equivalent process flow and equivalent devices. As such, the following example is for illustration purpose. The details such as film thickness, deposit temperature, additional films or integration can be varied.

In order to form the deep trench of the invention, a pad oxide layer 70 is deposited on the substrate 40. The pad oxide is approximately 53 angstroms thick. Next a pad nitrite layer 71 with a thickness of 1800 angstroms is deposited over the pad oxide layer. A layer of BSG 72 is deposited on the pad nitrite layer 71. BSG 72 is patterned by a photoresist mask 77. The mask provides openings 46 that will ultimately become the deep trenches shown in FIG. 9. First the BSG 72 is removed from the trench followed by resist strip and clean that leaves BSG on active region as a hardmask to protect the substrate from the subsequent deep trench etch. Next is the main Si etch by removal of the nitride and pad oxide layers and then a portion of the substrate material 40 to provide the deep trench structure shown in FIG. 10. Part of the BSG 72 on the active region was removed during the deep trench etch. The remaining BSG over the active region are subsequently removed. Then the trench is filled with a series of four layers. One of the features of this invention is that the trench is formed with a compound dielectric layer on its side walls and bottom. Initially, a layer of $Si_3N_4$ 75 is deposited using low pressure chemical vapor deposition to form a 4.3 nanometer coating on the walls and floor of the trench. Thereafter, the trench is exposed to dry oxygen and 900 degrees centigrade in order to oxidize portions of the silicon nitride layer and thereby form a composite dielectric of approximately 5.0 nanometers thickness. The dielectric is further exposed to the rapid thermal nitridation process to convert the top layer into oxynitride (76). Next, using a low pressure chemical vapor deposition process undoped amorphous polysilicon 77 is deposited in the trench. The polysilicon is chemically and mechanically polished to provide a recess of approximately 0.5 microns. The remainder of the trench is filled with a chemical vapor deposition layer of TEOS that is approximately 5000 angstroms thick. The TEOS 78 is then chemically and mechanically polished. Thereafter, the high voltage, CMOS and memory devices may be formed in accordance with the process steps known in the art or set forth in my co-pending U.S. patent application Ser. No. 10/234,344 (now U.S. Pat. No. 6,841,824), filed Sep. 4, 2002 and incorporated herein by reference. The process disclosed in that co-pending application is carried through until just prior to forming the N+source and drains and P+source and drains of the CMOS and memory devices. At that point, the process described at the beginning of this specification is inserted in order to form the buried source bit line of the invention. During formation of the buried source bit line of the invention, the rest of the device is masked so that only the sources of the memory array are formed. Likewise, after completion of formation of the memory array, the memory array is then masked and the CMOS devices are opened in order to form the N+ and P+ sources and drains.

The process described above may be modified using deep trench isolation formation and adding decoupling capacitor. This may be achieved by replacing the undoped polysilicon 77 with a doped polysilicon in a well known in-situ doped process; e.g., doping is through gas flow during the deposition for better uniformity. Suitable gases such as phosphine ($PH_3$) and $B_2H_6$ for N-doped and P-doped polysilicon, respectively, are flowed over the deep Nwells for positive polarity, or over the Pwell or substrate for negative polarity. For the memory array portion, we follow above flow with the polysilicon chemically and mechanically polished to provide a recess of approximately 0.5 microns. The remainder of the trench is filled with a chemical vapor deposition layer of TEOS that is approximately 5000 angstroms thick. For the decoupling capacitor portion, none or a small recess is provided in the end and the process adds contacts for the top electrode connection.

Figure 12:
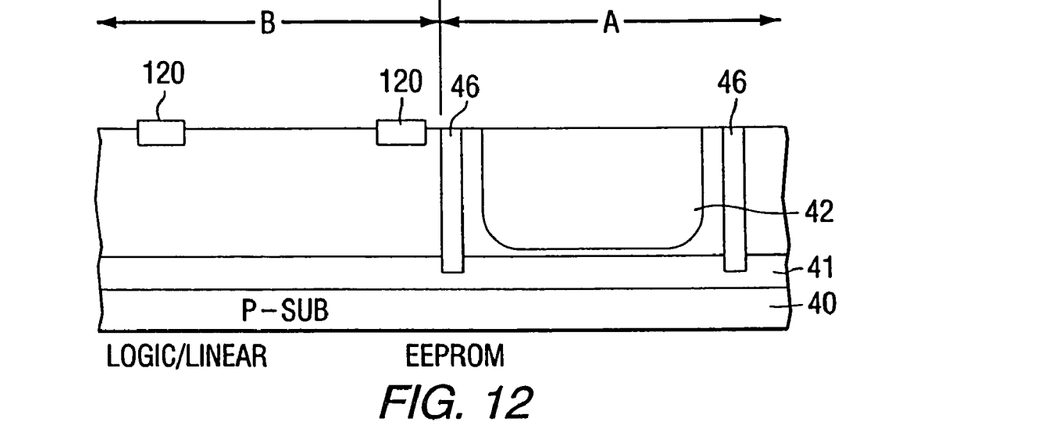
FIGS. 12–19 show steps for making a system on chip devices with memory, logic and linear transistors.
Figure 13:
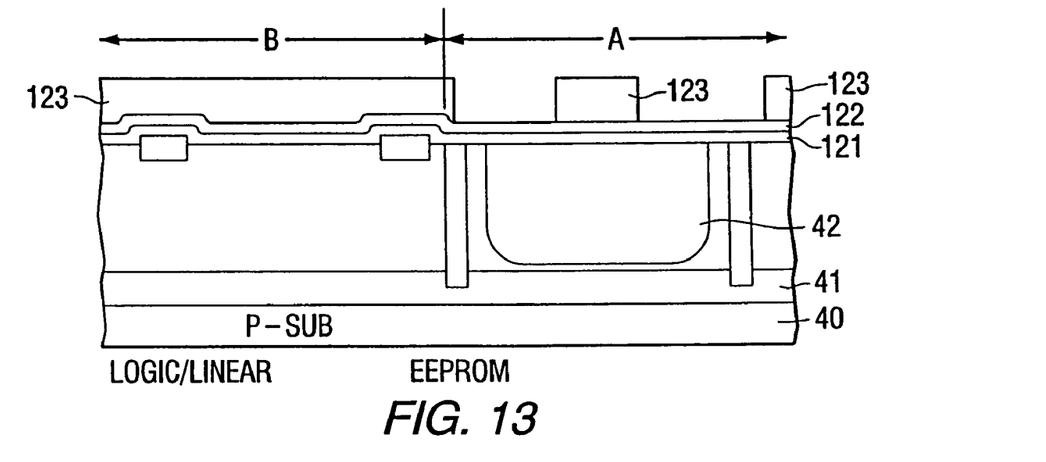

Turning to FIG. 12, the P-type substrate 40 is suitably patterned to form shallow trench isolation regions 120. The trench isolation regions 120 isolates each pair of CMOS transistors and any linear or high voltage devices formed on the substrate. The deep trenches 46 separate the memory columns from each other and from the other devices. Those skilled in the art understand that the invention may be made on an N-type substrate where the dopings are suitable reversed. As shown in FIG. 13, the substrate is then covered with a floating gate oxide 121 followed by a layer 122 of polysilicon. Prior to deposition of the layers, a suitable portion of the substrate, such as portion A, is separately patterned and implanted to have a triple-well comprising N-well 41 that encloses P-well 42. A logic CMOS pair of transistors is in region B. Those B regions may include transistors other than CMOS logic pairs. Those skilled in the art understand that transistor of one conductivity type may be formed in the B regions and types of transistors may be logic or linear, including and not limited to power transistors such as LDMOS transistors.

Figure 14:
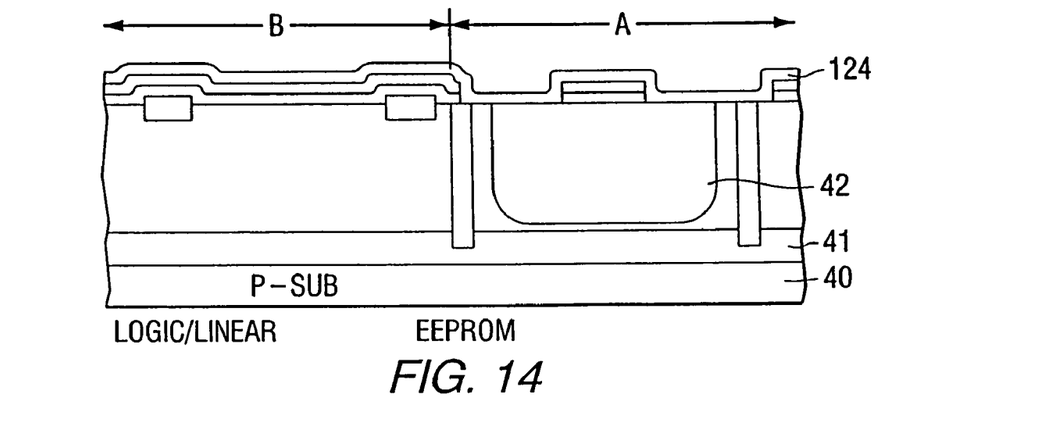
Figure 15:
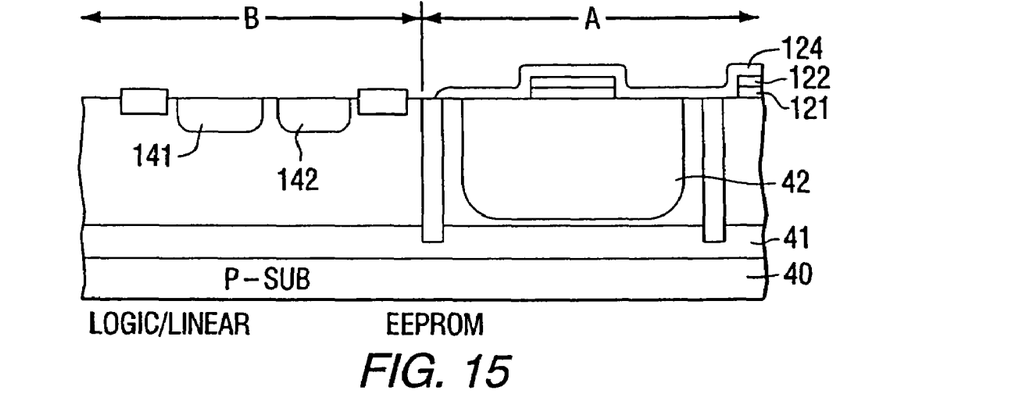

The oxide and polysilicon layers are then patterned with photoresist 123 to form a floating gate slot (parallel to bitline). Turning to FIG. 14, a layer 124 of ONO interpoly dielectric is deposited over the substrate. The layer 124 comprises sequentially a thermally grown bottom oxide, a deposited layer of low temperature deposited polysilicon 15 that is re-oxidized to form top oxide at later time. The layer 124 is suitably patterned by photoresist 123 to form two of the three layers of the ONO interpoly dielectric in the EEPROM stack as shown in FIG. 15. At this point, the layer 124 and polysilicon layer 122 are stripped from the peripheral regions B and they are suitably patterned and implanted to form P-wells 142 and N-wells 141.

Figure 16:
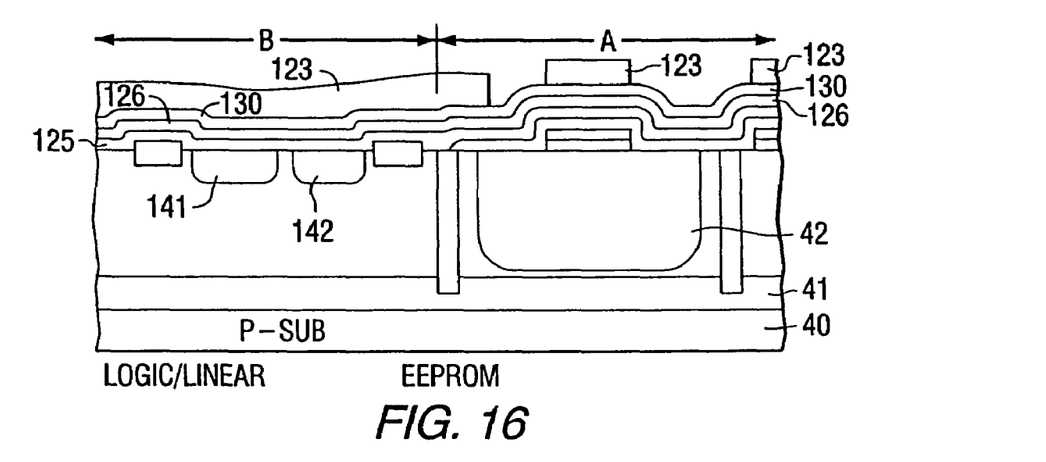

As shown in FIG. 16, the substrate 40 is covered with a layer 125 of oxide followed by a second layer of polysilicon 126. The layer 125 forms the gate oxide layer for the logic and linear devices and forms the upper oxide layer of the ONO dielectric layer 124. The polysilicon layer 126 is patterned and etched to form the control gates of the EEPROM transistors and the logic and linear transistors.

Figure 17:
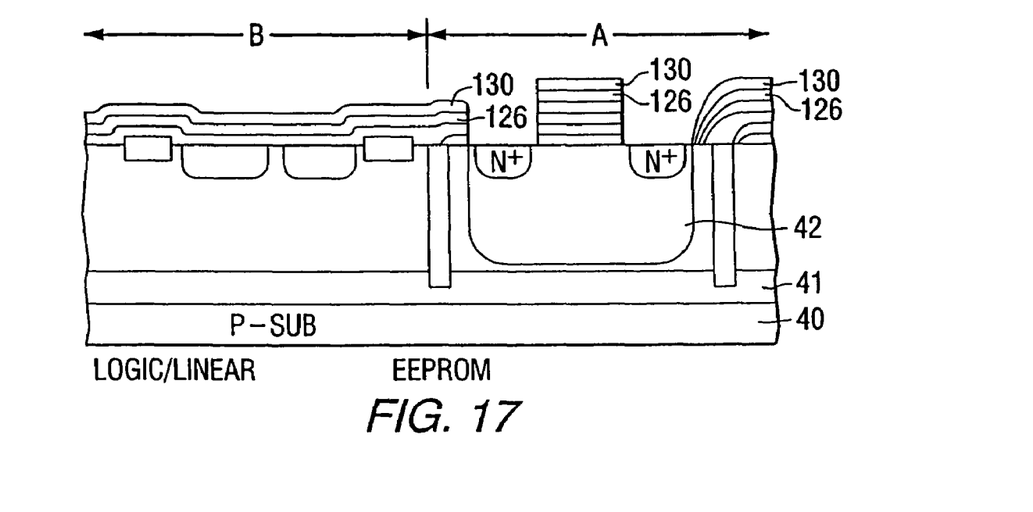
Figure 18:
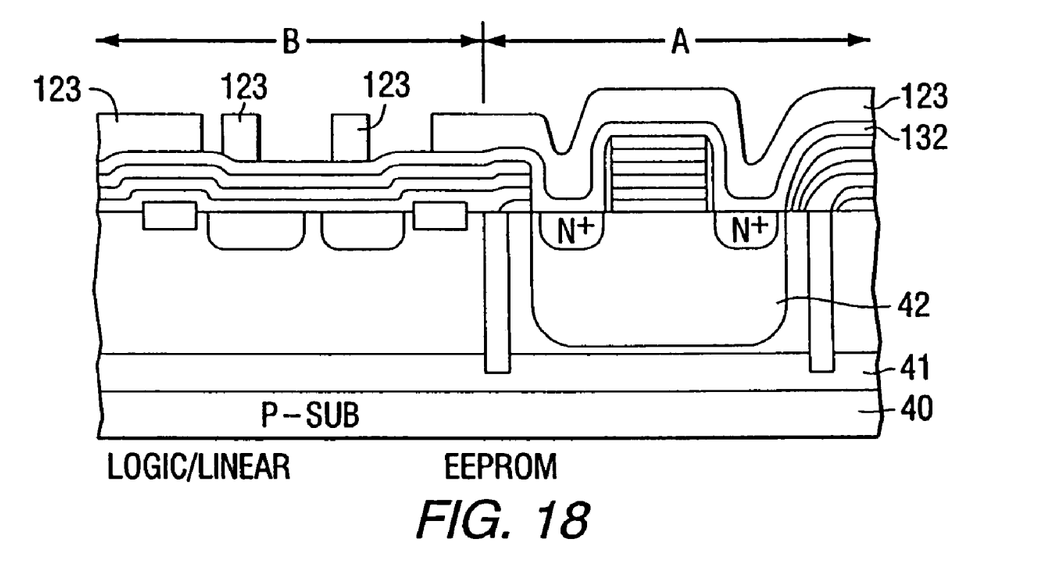

The description below creates a dual sidewall oxide that optimizes a memory cell's reliability and maintains a shallow logic device S/D junction, similar to my copending U.S. patent application Ser. No. 10/234,344, filed Sep. 4, 2002. A first TEOS layer 130 is deposited over the second polysilicon layer 126. The first TEOS layer 130 is then suitably patterned with photoresist 123 to open the source and drain regions of the EEPROM. Source and drain regions are suitably implanted to form the source and drains of the EEPROM. (See FIG. 17) After that, the first TEOS layer 130 is removed by a high selective reactive ion etching, stopping on polysilicon layer 126. Then the sidewalls of the gate stack of the EEPROM are oxidized to provide a sidewall oxide suitable for flash stack transistors. Oxidation takes place at about 850–950° centigrade in a furnace for approximately 30 minutes in order to grow a sidewall that is about 15 nanometers thick on the polysilicon regions of the gate stack. (See FIG. 18) Thereafter, a second TEOS layer 132 is deposited over the substrate 40. TEOS layer 132 is suitably patterned with a photoresist layer 123 to form the gates and to open the source and drains of the logic and linear transistors. (See FIG. 19)

Figure 19:
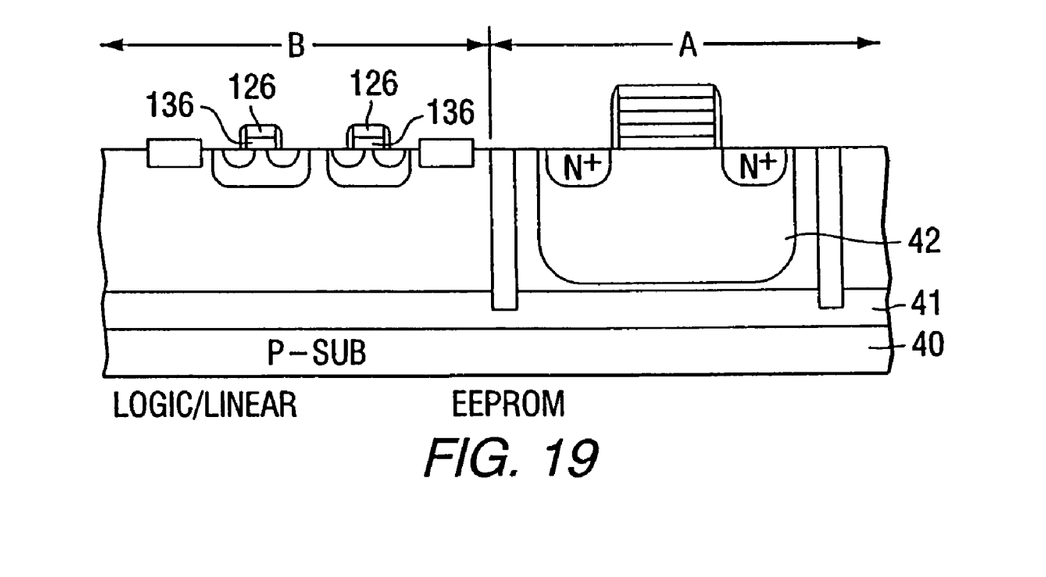

The sources and drains of the logic and/or linear transistors are implanted, the second TEOS layer 132 is removed by reactive ion etching and the gates of the peripheral transistors receive a thinner sidewall oxide. That sidewall oxide is approximately 6 nanometers and is generated by a relatively short rapid thermal annealing step. The rapid thermal annealing is carried out at about 700–900° C. for about 10–20 second. It activates the doping in the logic and/or linear transistors but does not drive them very far into the substrate. This results in a logic and/or linear region with relatively closely spaced transistors.

Then the substrate is masked to expose only selected source regions in the memory array. Those regions are exposed and implanted with a P-type implant to form the P+ body ties, to the source N-junctions of the memory. Additional metal straps from upper levels of metal (e.g. M3) will bring the source rail resistance down. Not every source region requires a metal strap and every thirty-second or sixty-fourth source region is sufficient. There is no bitline pitch increase due to the addition of metal strap M3 since both M1 bitline and M3 source line run on top of each other. Those skilled in the art can realize the benefit and achieve a 50% cell area reduction or about a 30% chip reduction.

As a result of the process described above a manufacturer may produce a single integrated circuit with logic and/or linear and memory devices having different sidewall insulating thicknesses. In the logic and/or linear region the sidewalls can be optimized to be as thin as needed to provide more transistor in the region allowed for logic and/or linear devices. In the memory region the memory devices are optimized to have a thick enough sidewall oxide to prevent the charge stored in the interpoly dielectric layer from having an unwanted effect on the operation of the memory transistors.

The triple well allows the user to control the voltage on the deep buried N-well 41 and the shallow P-well 42 in order to program, erase and read the array. A typical set of operating parameters to program, erase and read appears in the following table where the voltages applied to the selected and unselected components are identified.

TABLE 1

|  | Read (volts) | Program (volts) | Erase (volts) |
| --- | --- | --- | --- |
| Selected Cells |  |  |  |
| Gate | VPP = 2.5 | +14 volts | −14 |
| Drain | VDD = 1.2 | −3 | +3 |
| Source/P-Well | 0 | −3 | +3 |
| Deep N-Well | 0 | 0 | +3 |
| Unselected Cells |  |  |  |
| Gate | 0 | 0/−3 | 0/+3 |
| Drain disturb | DR turn-on |  |  |
| Drain | 0 | +3 | +3 |
| Gate disturb | DR turn-on |  |  |
| Source/P-well | 0 | +3 | +3 |
| Deep N-Well | 0 | +3 | +3 |

In operation, when the user desires to read the contents of a given transistor cell, the word line associated with the transistor is raised to approximately 2.5 volts. Likewise, the bit line connected to the drain is coupled to a voltage of approximately 1.25 volts. The output of the cell then appears on the other or source bit line. The deep N well is held at zero volts. The voltages for all of the other electrodes of the rest of the array are set to zero volts.

In order to program a transistor, the word line of the gate with the selected transistor are raised to +14 volts. The drain bit line is lowered to −3 volts as is the buried source bit line to provide a uniform voltage across the channel. The deep N well 41 is set to zero volts. The gates of the unselected transistors are either set to zero or −3 volts and the other electrodes are set to +3 volts. In order to erase a program transistor, the drain and the source bit lines are set to +3 volts and the gate is set to −14 volts. The gates of the unselected transistors are set to between zero and +3 volts and all of the other electrodes are set to +3 volts.

Figure 6:
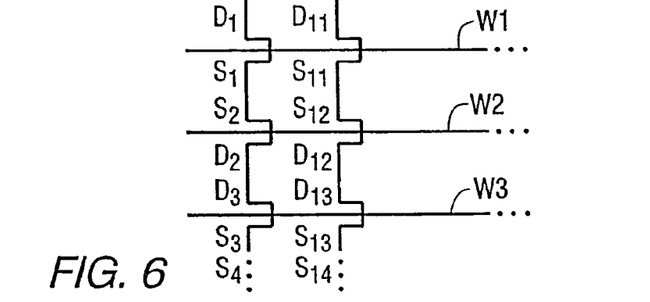
FIG. 6 is a partial electrical schematic of the array.

The configuration of the array is shown schematically in FIG. 6. The drain and source regions are aligned with each other in a given column and the columns 11.n are parallel to each other. The word lines 15.n run transverse to the columns 11.n. The drains are connected together by a first, raised bit line 13. The sources are connected together by a buried bit line 14. With this arrangement, there source and drain regions are aligned with each other and require minimal active areas. Likewise, there is only one metal line. This reduces the complexity of interconnecting the transistors and saves valuable space in the active areas of the device. With the invention only one set of vias and vertical contacts are needed for the single metal line.

Having thus disclosed the salient features of the invention, those skilled in the art will appreciate that further additions, substitutions and changes may be made to the above details without departing from the spirit and scope of the appended claims.

What I claim is:

1. A semiconductor device comprising:
    a semiconductor substrate of a first conductivity type;
    a buried well region of a second conductivity type disposed within the substrate;
    a well region of the first conductivity type disposed within the substrate, the well region being separated from the substrate by the buried well region;
    a plurality of non-volatile memory cells disposed within the well region; and
    a deep trench isolation region disposed in the substrate adjacent the non-volatile memory cells, the deep trench isolation region extending through the well region and into the buried well region; wherein said deep trench isolation region comprises a trench filled with a conductive material, the conductive material being isolated from a top surface, and the material being part of a decoupling capacitor.

2. The device of claim 1, further comprising a plurality of logic devices disposed in the substrate, ones of the logic devices isolated from other ones of the logic devices by shallow trench isolation.

3. The device of claim 1, further comprising a plurality of linear devices disposed in the substrate, ones of the linear devices isolated from other ones of the linear devices by shallow trench isolation.

4. The device of claim 1, further comprising peripheral logic disposed in the substrate, the peripheral logic isolated from the non-volatile memory cells by deep trench isolation.

5. The device of claim 4, wherein the peripheral logic includes at least one device selected from the group consisting of row decoders, column decoders and transfer gates.

6. The device of claim 4, wherein a deep trench isolation area separates the peripheral logic from one of the memory cells by a distance of less than one micron.

7. The device of claim 1, wherein the non-volatile memory cells are arranged in columns, and wherein the deep trench isolation region isolates one of the columns of memory cells from an adjacent one of the columns of memory cells.

8. The device of claim 7, wherein the non-volatile memory cells each comprise a one-transistor flash memory cell.

9. The device of claim 8, wherein each non-volatile memory cell comprises:
    a floating gate;
    a common source that is shared with an adjacent transistor such that the common source is disposed between the floating gate of the memory cell and the floating gate of the adjacent memory cell; and
    a drain located such that the floating gate of the memory cell is disposed between the common source and the drain of the memory cell.

10. The device of claim 9, further comprising:
    a buried bitline coupling the common sources of memory cells within a column; and
    a metal contact layer coupling the drains of memory cells within the column, the metal contact layer disposed over the substrate and aligned with the drains and sources.

11. The device of claim 1, wherein the deep trench isolation region extends to a depth of in the range of between about 1 µm and about 3 µm.

12. A semiconductor device comprising:
    a semiconductor substrate of a first conductivity type;
    a buried well region of a second conductivity type disposed within a first portion of the substrate, the substrate being of a first conductivity type;
    a well region of the first conductivity type disposed within the first portion of the substrate, the well region being separated from the substrate by the buried well region;
    a memory array disposed within said first portion of the semiconductor substrate, the memory array including a plurality of non-volatile memory cells;
    circuitry disposed within a second portion of the semiconductor substrate; and
    a deep trench isolation region disposed in the semiconductor substrate between the memory array and the circuitry, to separate the memory array from the circuitry and said deep trench isolation region extending through the well region and into the buried well region.

13. The device of claim 12, further comprising a shallow trench isolation region disposed in the second portion of the semiconductor substrate, the shallow trench isolation region isolating transistors that comprise the circuitry.

14. The device of claim 13, wherein the transistors comprise CMOS transistors.

15. The device of claim 13, wherein the transistors comprise linear transistors.

16. The device of claim 12, wherein the deep trench isolation region extends to a depth of between about 1 µm and about 3 µm.

17. The device of claim 12, wherein the non-volatile memory cells each comprise a one-transistor flash memory cell.

18. The device of claim 12, wherein each non-volatile memory cell comprises:
    a floating gate;
    a common source that is shared with an adjacent transistor such that the common source is disposed between the floating gate of the memory cell and the floating gate of the adjacent memory cell; and
    a drain located such that the floating gate of the memory cell is disposed between the common source and the drain of the memory cell.

19. The device of claim 18, further comprising:
    a buried bitline coupling the common sources of memory cells within a column; and
    a metal contact layer coupling the drains of memory cells within the column, the metal contact layer disposed over the substrate and aligned with the drains and sources.

20. The device of claim 12 wherein the deep trench isolator region separates memory array from the circuitry by a distance of less than one micron.

* * * * *